United States Patent [19]

Haga et al.

[11] Patent Number: 5,555,523

[45] Date of Patent: Sep. 10, 1996

[54] SEMICONDUCTOR MEMORY DEVICE

[75] Inventors: Ryo Haga, Yokohama; Tomoaki Yabe, Kawasaki; Shinji Miyano, Yokohama; Kenji Numata, Yamato, all of Japan

[73] Assignee: Kabushiki Kaisha Toshiba, Kawasaki, Japan

[21] Appl. No.: 556,148

[22] Filed: Nov. 9, 1995

[30] Foreign Application Priority Data

Nov. 11, 1994 [JP] Japan .................................. 6-277509

[51] Int. Cl.$^6$ .................................................. G11C 7/00
[52] U.S. Cl. .................... 365/203; 365/189.05; 365/194; 365/202; 365/205
[58] Field of Search ..................................... 365/202, 203, 365/194, 205, 189.05

[56] References Cited

U.S. PATENT DOCUMENTS

| 4,813,021 | 3/1989 | Kai et al. .................................. 365/194 |
| 5,444,662 | 8/1995 | Tanaka et al. .......................... 365/203 |
| 5,479,374 | 12/1995 | Kobayashi et al. ................. 365/203 X |

Primary Examiner—Son Dinh
Attorney, Agent, or Firm—Banner & Allegretti, Ltd.

[57] ABSTRACT

A semiconductor memory device comprises a plurality of memory cells including at least a first memory cell and a second memory cell, a first bit line connected to the first memory cell, a second bit line connected to the second memory cell and paired with the first bit line, an equalizer connected between the first and second bit lines, an amplifier connected between the first and second bit lines, a first driving signal line connected to the amplifier and drives the amplifier, a second driving signal line connected to the amplifier and paired with the first driving signal line, a driver for driving the amplifier and connected to the first and second driving signal lines and containing a precharger for presetting the potentials of the first and second driving signal lines to a predetermined precharge potential and a driving signal supply circuit for supplying a driving signal to the first and second driving signal lines, and a control circuit for controlling the equalizer and the driver, wherein the control circuit controls the equalizer and the precharger independently so that the precharger continues supplying the precharge potential to the first and second driving signal lines until essentially immediately before the driving signal supply circuit supplies the driving signal to the first and second driving signal lines.

20 Claims, 14 Drawing Sheets

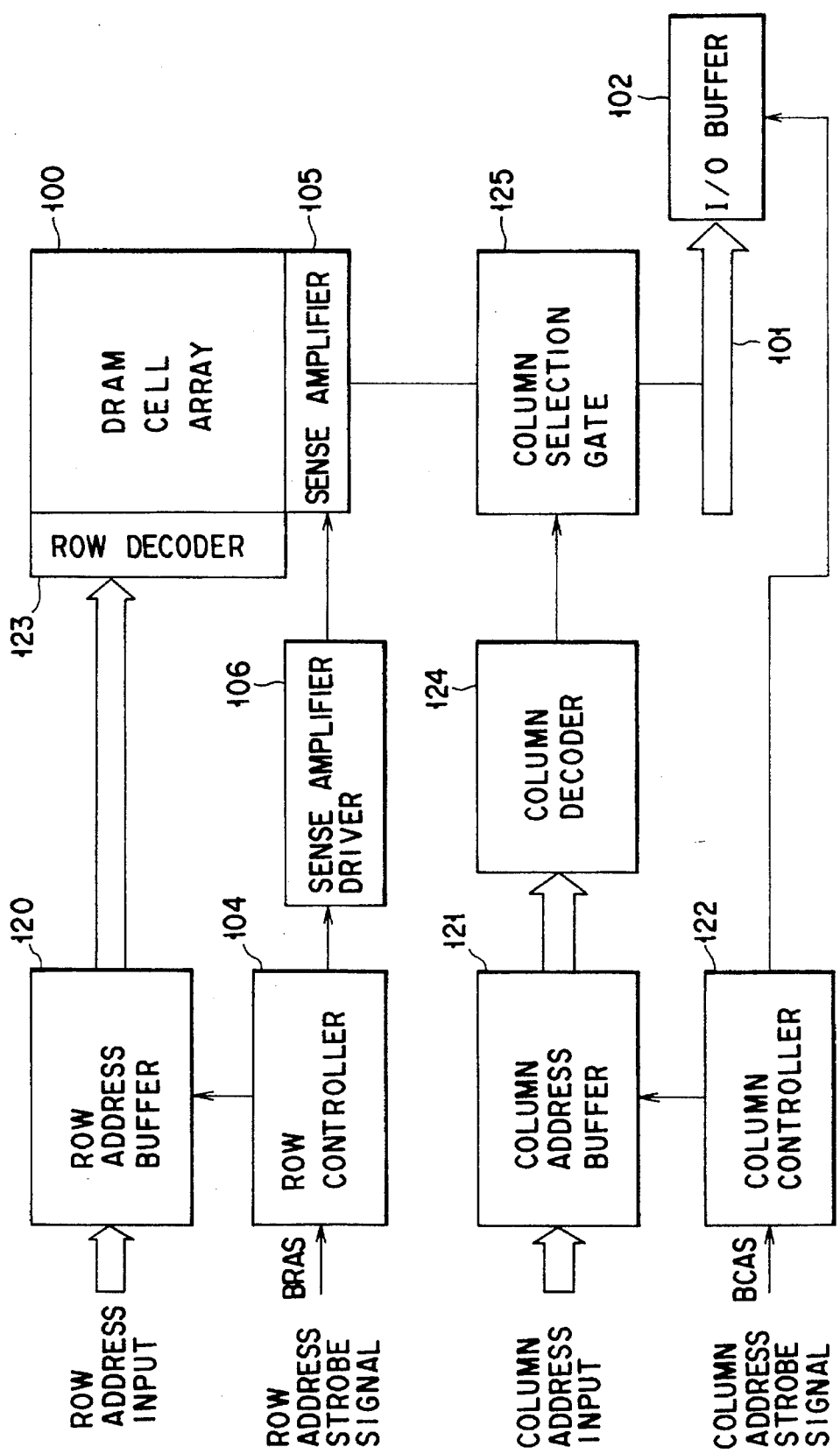
F I G. 1

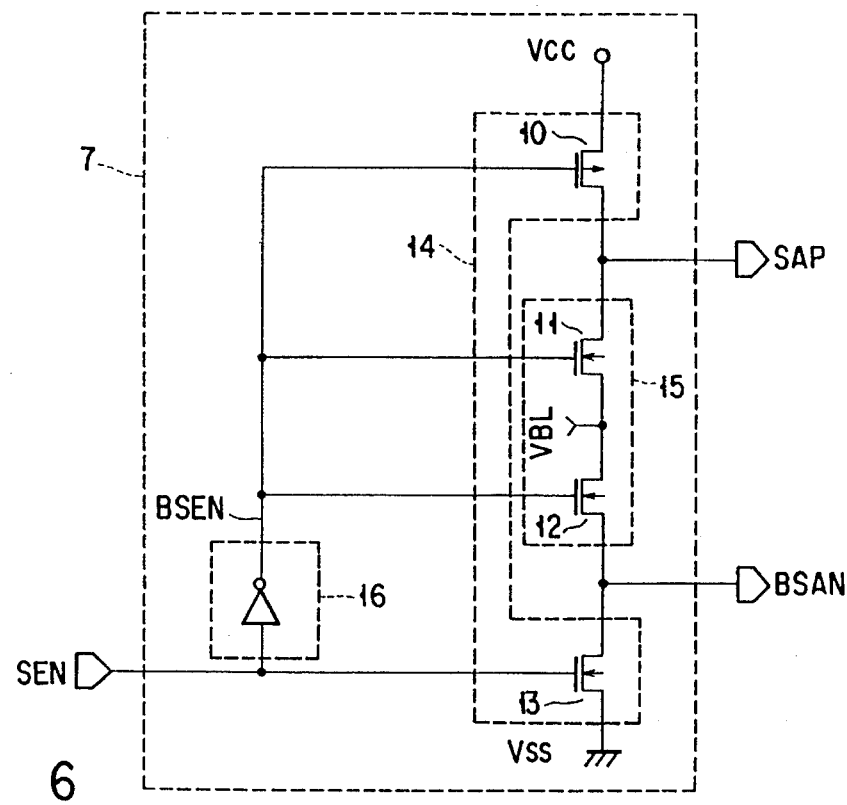
F I G. 6
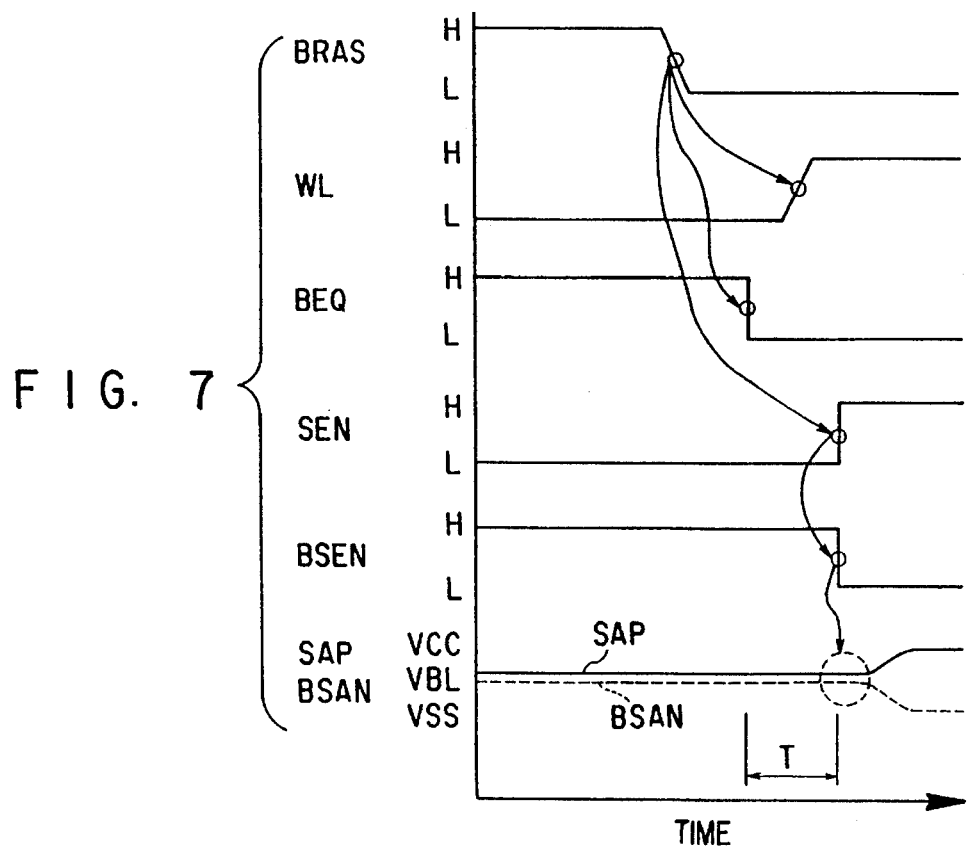
F I G. 7

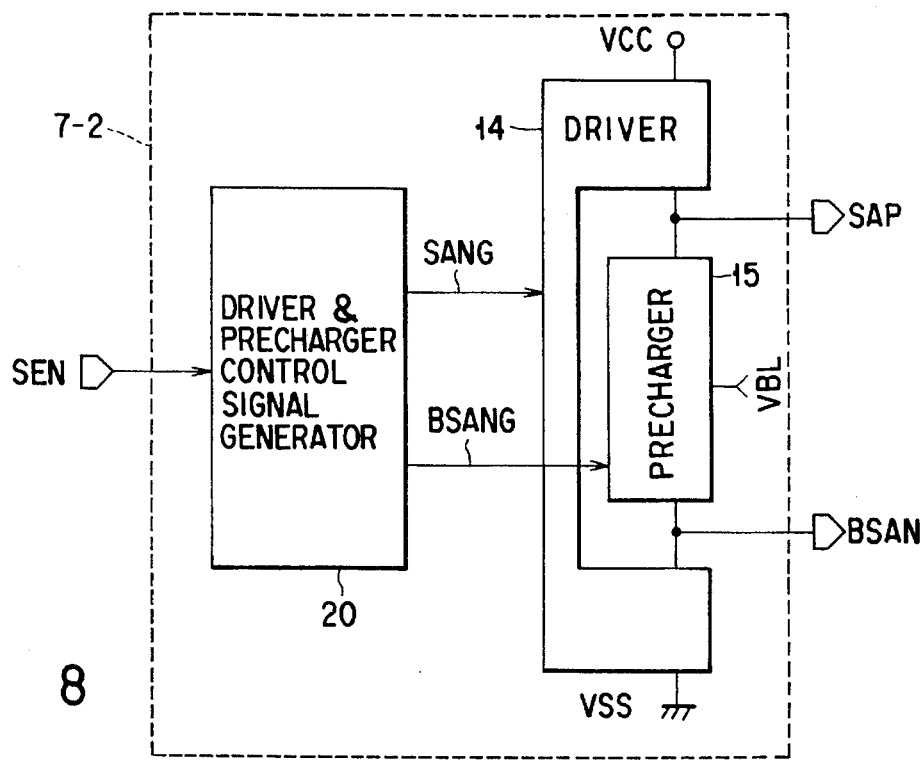
F I G. 8
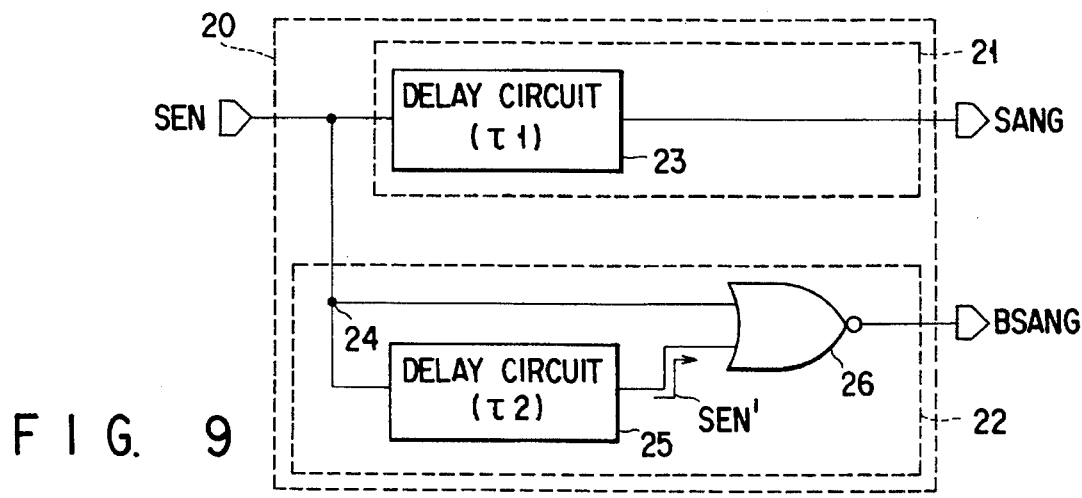
F I G. 9
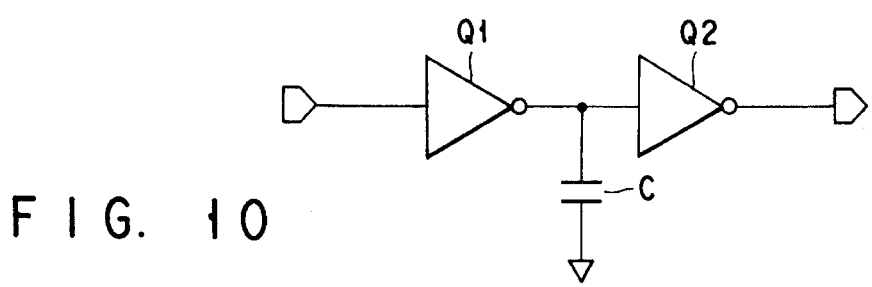
F I G. 10

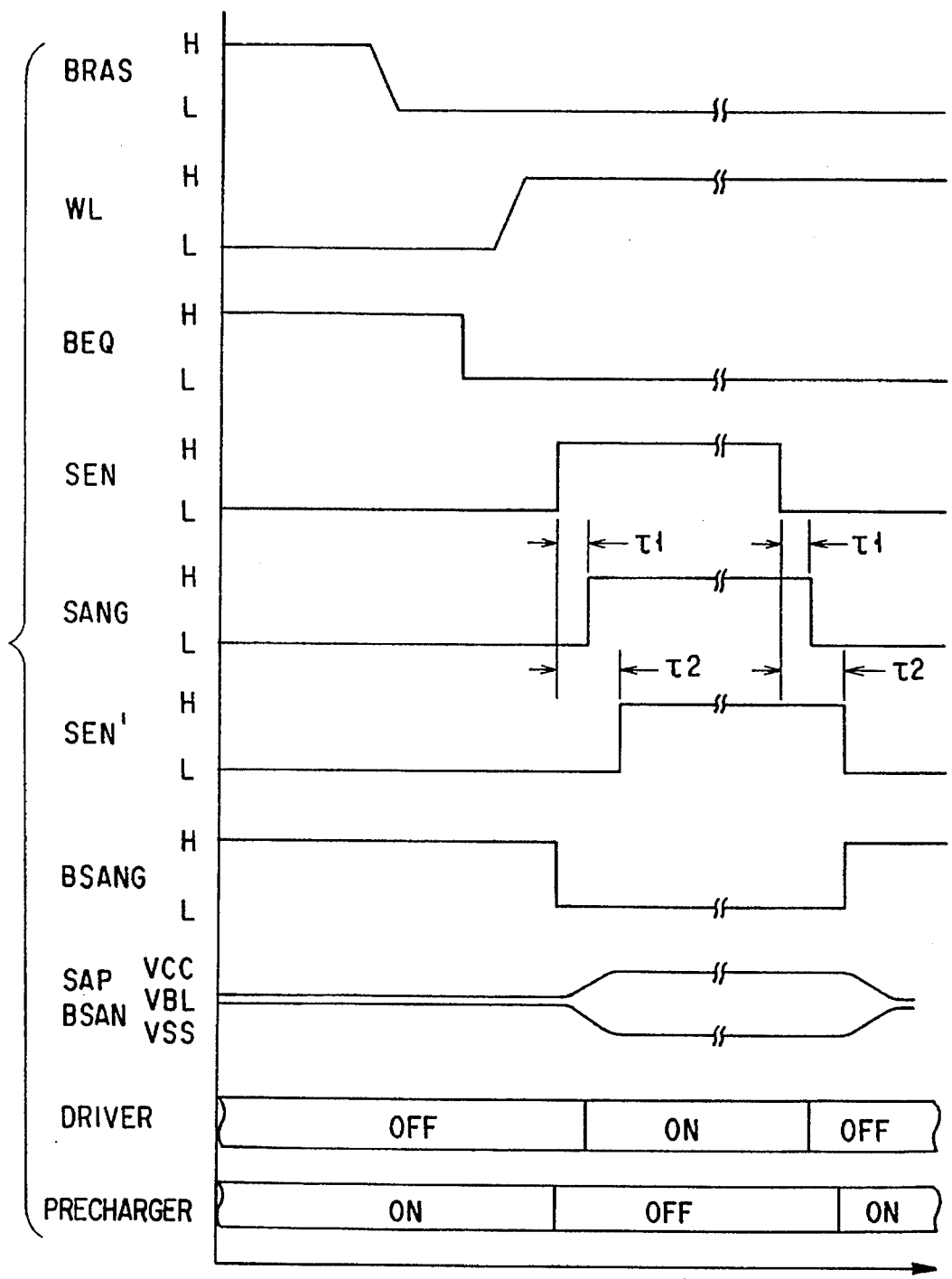
F I G. 12

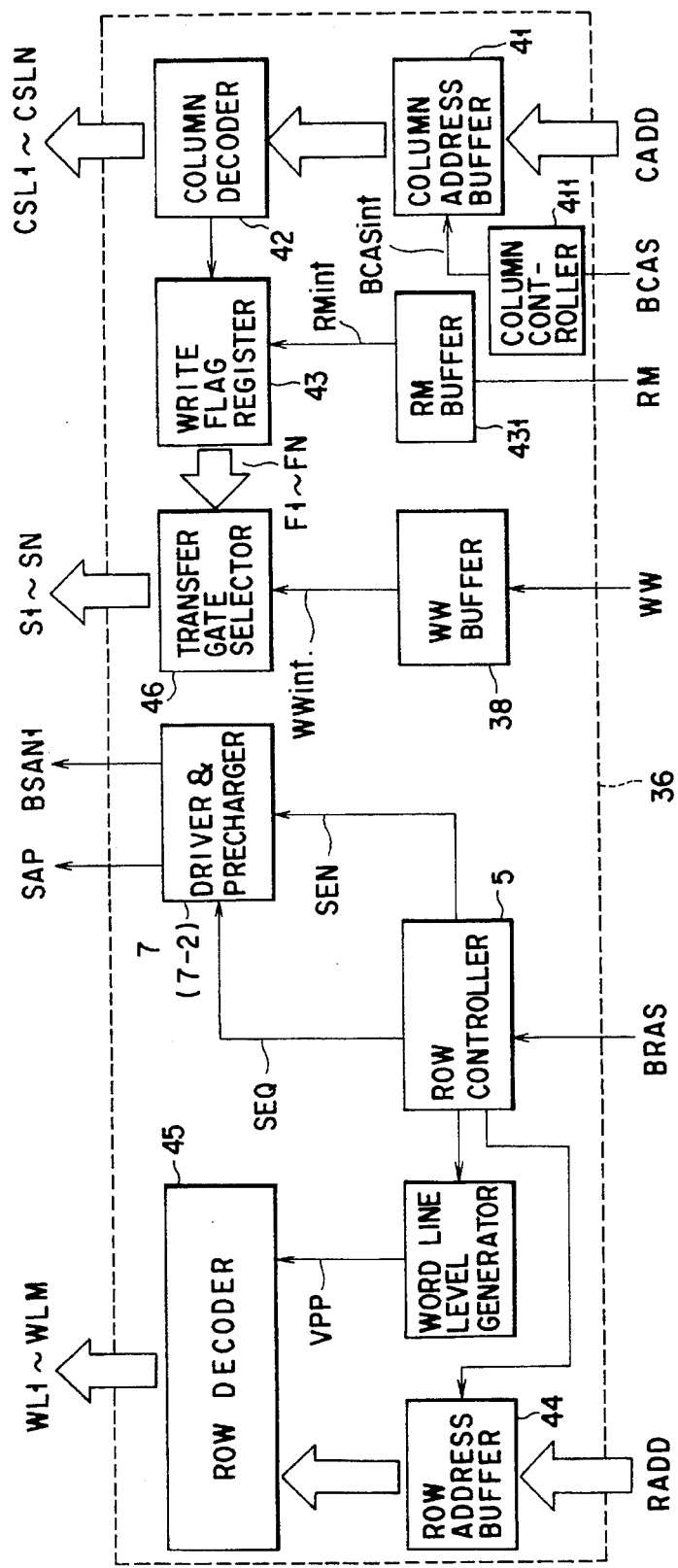
F I G. 15

1

SEMICONDUCTOR MEMORY DEVICE

BACKGROUND OF THE INVENTION

1. Field of the Invention

This invention relates to a semiconductor memory device, and more particularly to a semiconductor memory device containing a sense amplifier for amplifying the potential difference between bit lines with fewer faulty operations.

2. Description of the Related Art

With advances in integrated-circuit technology, semiconductor memory devices, especially dynamic random access memories (hereinafter, referred to as DRAMs) have been used widely in the field of electronics. A DRAM memory cell is basically composed of one transistor and one capacitor. DRAMs are suitable for high integration because of a smaller number of elements used and are less expensive in bit unit price, with the result that they are used in large numbers for computers, communication equipment, and image processing equipment. Information is memorized in the form of the charge stored in a capacitor. To retain the information, the operation of reading and writing at regular intervals of time, known as refresh, is required.

FIG. 1 is a block diagram of a DRAM, showing the basis configuration. Referring to the figure, the flow of signal will be explained. In synchronization with the row address strobe signal (BRAS) and the column address signal (BCAS), the row address input and the column address input enter the row address buffer 120 and the column address buffer 121 and are latched there, respectively, in a time division manner. A row decoder 123 selects and drives a word line (not shown) and thereby accesses the desired row of memory cells in a memory cell array 100.

The information in the memory cells in the accessed row is transferred to a bit line (not shown) and amplified at a sense amplifier 105. At the same time, the information is rewritten into the memory cells.

A column decoder 124 selects and drives a column selection gate 125 according to the column address input and thereby selects the output of the sense amplifier 105 corresponding to the desired column. The selected information is read onto a data line (not shown) and transferred to an I/O buffer 102 via a data bus 101. The I/O buffer 102 is connected to an external I/O section (not shown).

The series of operations is controlled by an internal synchronizing signal and executed in a predetermined sequence with predetermined timing to prevent the memory cell information from being destroyed.

FIG. 2 is a circuit diagram of a conventional DRAM sense amplifier and an equalizer circuit which is omitted in FIG. 1. The same parts as those in FIG. 1 are indicated by the same reference symbols.

As shown in FIG. 2, there are provided a bit line BL connected to a memory cell (not shown) in the memory cell array 100, and a bit line BBL connected to another memory cell (not shown) and paired with the bit line BL. The bit lines BL, BBL connect the memory cells to the DQ bus 101. The column selection gate shown in FIG. 1 is not shown in FIG. 2. The DQ bus 101 is connected to the I/O buffer 102. The I/O buffer 102 exchanges data from outside the device to the DQ bus 101 and from the DQ bus 101 to outside the device.

Between the bit lines BL and BBL, there is provided a bit-line equalizer 103 for equalizing the potential difference between the potential of the bit line BL and that of the bit line BBL. The equalizer 103 is turned on and off by the equalize signal BEQ from a row controller 104.

Between the bit lines BL and BBL, there is also provided a sense amplifier 105 for amplifying the potential difference between the potential of the bit line BL and that of the bit line BBL. The sense amplifier 105 is driven by a sense amplifier driver 106 activated by an activate signal SEN from the row controller 104. The sense amplifier 105 contains a PMOS FET (P channel type MOS field effect transistor) sense amplifier section and an NMOS FET (N channel type MOS field effect transistor) sense amplifier section 108. A driving signal line SAP is connected to the PMOS FET sense amplifier section 107 and a driving signal line BSAN is connected to the NMOS FET sense amplifier section 108.

FIG. 3 is a circuit diagram of the sense amplifier driver 106 shown in FIG. 2. As shown in FIG. 3, the sense amplifier driver 106 contains a PMOS FET 110 that supplies a VCC level signal as a driving signal to a driving signal line SAP, an NMOS FET 113 that supplies a VSS level potential (e.g., the ground potential) as a driving signal to a driving signal line BSAN, an NMOS 111 that supplies a VBL level (about VCC/2 level) potential as a precharge potential to a driving signal line SAP, and an NMOS FET 112 that supplies about a VBL level potential as a precharge potential to a driving signal line BSAN.

In the conventional sense amplifier driver 106, the driving signal line pair SAP, BSAN is precharged by using the equalize signal BEQ that is used to equalize the sense amplifier.

Since the activate signal SEN is output later than the equalize signal BEQ, however, the conventional sense amplifier driver 106 permits the occurrence of a period of time during which the potentials of the driving signals SAP, BSAN are unstable (floating) as shown in the operating waveform diagram of FIG. 4. When noise is introduced to the driving signal line SAP or BSAN during a period when the potential is unstable, the potential of the driving signal line can change to an H (high) level or an L (low) level. When the potential of the driving signal line goes to the H level or the L level, this will allow power to be supplied to the sense amplifier 105, resulting in a chance of a faulty operation taking place. As described above, the conventional sense amplifier driver has contained a factor that permits faulty operations.

SUMMARY OF THE INVENTION

The object of the present invention is to provide a semiconductor memory device capable of reducing the possibility that the sense amplifier will operate erroneously.

To accomplish the foregoing object, a semiconductor memory device according to a first aspect of the present invention comprises: a plurality of memory cells including at least a first memory cell and a second memory cell; a first bit line connected to the first memory cell; a second bit line connected to the second memory cell and paired with the first bit line; equalize means that is connected between the first bit line and the second bit line and equalizes the potential difference between the potential of the first bit line and that of the second bit line; amplifying means that is connected between the first bit line and the second bit line and amplifies the potential difference between the potential of the first bit line and that of the second bit line; a first driving signal line that is connected to the amplifying means and drives the amplifying means; a second driving signal line that is connected to the amplifying means and paired with the first driving signal line; driving means that drives the amplifying means, said driving means being connected to the first driving signal line and the second driving signal line and containing precharge means for presetting the potential of the first driving signal line and that of the second driving signal line to a predetermined precharge potential and driving signal supply means for supplying a driving signal to the first driving signal line and the second driving signal line; and control means for controlling the equalize means and the driving means, wherein the control means controls the equalize means and the precharge means independently so that the precharge means continues supplying the precharge potential to the first driving signal line and the second driving signal line until essentially immediately before the driving signal supply means supplies the driving signal to the first driving signal line and the second driving signal line.

It is preferable that the control means should perform control with the timing that the precharge means contained in the driving means is turned off being later than the timing that the equalize means is turned off.

Furthermore, the control means outputs a first activate signal for activating the equalize means and a second activate signal for activating the driving means and, using only the second activate signal, controls the precharge means contained in the driving means and the driving signal supply means contained in the driving means. The control means outputs the second activate signal after a specific time has elapsed since it outputted the first activate signal.

Furthermore, with a semiconductor memory device according to a second aspect of the present invention, the control means independently outputs a first activate signal for activating the equalize means and a second activate signal that is a specific time later than the first activate signal and activates the driving means, and the driving means further contains generating means for generating from the second activate signal a first control signal for controlling the driving signal supply means and a second control signal for controlling the precharge means wherein the precharge means continues supplying the precharge potential to the first driving signal line and the second driving signal line until essentially immediately before the driving signal supply means supplies the driving signal to the first driving signal line and the second driving signal line, and the generating means activates the first control signal and the second control signal with a delay between them so that the precharge means and the driving signal supply means may each be activated with different timing.

It is preferable that the generating means should activate the first control signal later than the second control signal and deactivate the second control signal later than the first control signal.

Furthermore, the generating means contains first conversion means that converts the second activate signal into the first control signal via first delay means, and second conversion means that receives the second activate signal and a delayed activate signal obtained by delaying the second activate signal via second delay means, logically combines the second activate signal and the delayed activate signal, and converts the second activate signal into the second control signal.

Furthermore, the delay time of the first delay means is set shorter than the delay time of the second delay means.

A semiconductor memory device according to a third aspect of the present invention comprises: a memory cell array in which a plurality of memory cells are arranged in rows and columns; a plurality of pairs of bit lines, to each of which the plurality of memory cells provided in the corresponding one of the columns in the memory cell array and arranged in the direction of the columns are connected; a plurality of equalize means, each of which is connected between the bit lines of the corresponding one of the plurality of pairs of bit lines and equalizes the potential difference between the bit lines; a plurality of amplifying means, each of which is connected between the bit lines of the corresponding one of the plurality of bit-line pairs and amplifies the potential difference between the bit lines; a first driving signal line that is connected to the plurality of amplifying means and drives the amplifying means; a second driving signal line that is connected to the plurality of amplifying means and paired with the first driving signal line; driving means that drives the plurality of amplifying means, said driving means being connected to the first driving signal line and the second driving signal line and containing precharge means for presetting the potential of the first driving signal line and that of the second driving signal line to a predetermined precharge potential and driving signal supply means for supplying a driving signal to the first driving signal line and the second driving signal line; a data bus serving as a path for the externally supplied input data items to the plurality of memory cells; a plurality of latch-type storage means, each of which is provided in the corresponding one of the columns in the memory cell array, is connected to the data bus and temporarily stores the corresponding one of the input data items supplied from the data bus; and a plurality of transfer means, which are respectively connected between the plurality of latch-type storage means and the plurality of amplifying means and transfer, in unison for each of the rows, the input data items temporarily stored in the latch-type storage means from the latch-type storage means to the amplifying means, wherein after the equalize means has equalized the voltage between the bit lines of the pair, the operation of storing the corresponding input data item from the data bus into each of the plurality of latch-type storage means is repeated for each of the input data items, and after the operation of storing the input data in the plurality of latch-type storage means has been completed for one of the rows, the transfer means transfers the input data stored in the latch-type storage means to the amplifying means in unison, and thereafter the precharge means continues supplying a precharge potential to the first driving signal line and the second driving signal line until essentially immediately before the driving signal supply means supplies the driving signal to the first driving signal line and the second driving signal line.

With the semiconductor memory devices according to the first to third aspects of the invention constructed as described above, because the equalize means and the precharge means are controlled independently, it is possible to prevent the precharging (equalizing) of the driving signal pair from being canceled even when the equalizing of the equalize means has been canceled, thereby eliminating the state where the potential of the driving signal pair becomes unstable. This prevents noise or the like from determining the potential of the driving signal line pair by accident as can take place when the potential of the driving signal line pair is unstable.

Furthermore, the semiconductor memory device according to the second aspect further has the function of preventing a penetrating current from flowing from the precharge potential to the power supply potential, because the supply means and the precharge means are not turned on with the same timing.

Furthermore, the semiconductor memory device according to the third aspect can prevent the driving signal line from dropping to a low potential before activating the amplifying means, because it fixes the first and second driving signal lines at the precharge potential VBL until essentially immediately before it activates the amplifying means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram of a DRAM, showing the basic configuration;

FIG. 6 is a circuit diagram of the sense amplifier driver of FIG. 5;

FIG. 7 is an operating waveform diagram to help explain the operation of the DRAM according to the first embodiment of the present invention;

FIG. 8 is a circuit diagram of a sense amplifier driver contained in a DRAM according to a second embodiment of the present invention;

FIG. 9 is a circuit diagram of a control signal generator of FIG. 8;

FIG. 10 shows an example of the delay circuit shown in FIG. 9;

FIG. 12 is an operating waveform diagram to help explain the operation of the DRAM with the delay time τ1 of the delay circuit being set shorter than the delay time τ2;

FIG. 15 is a detailed block diagram of the peripheral circuit section of FIG. 13;

DETAILED DESCRIPTION OF THE PREFERRED EMBODIMENTS

Hereinafter, the present invention will be explained through embodiments. Like parts are indicted by corresponding reference symbols throughout all of the drawings and repeated explanation of them will not be given.

(A first Embodiment)

Figure 5:
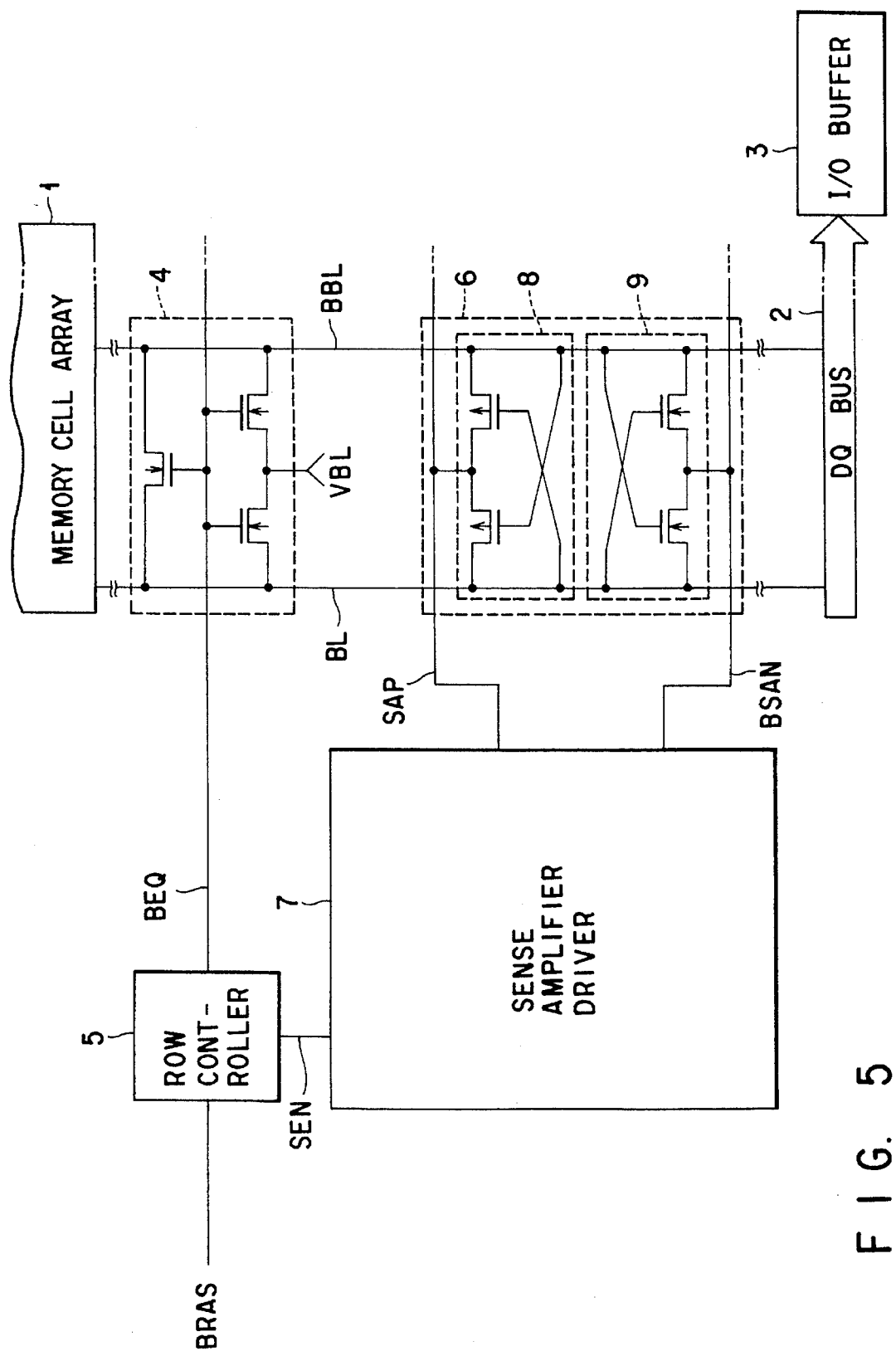
FIG. 5 is a circuit diagram of the sense amplifier peripheral circuitry in a DRAM according to a first embodiment of the present invention.

FIG. 5 is a schematic block diagram of a semiconductor memory device according to a first embodiment of the present invention. FIG. 6 is a circuit diagram of the sense amplifier driver 7 of FIG. 5.

As shown in FIG. 5, a bit line BL is connected to a memory cell (not shown) in a memory cell array 1 and a bit line BBL paired with the bit line BL is connected to another memory cell (not shown). The bit lines BL, BBL connect the memory cells to a DQ bus 2. The DQ bus 2 is connected to an I/O buffer 3. The I/O buffer 3 transfers data from outside the device to the DQ bus 2 and from the DQ bus 2 to outside the device.

Between the bit lines BL and BBL, there is provided a bit-line equalizer 4 for equalizing the potential difference between the potential of the bit line BL and that of the bit line BBL. The equalizer circuit 4 is turned on and off by the equalize signal BEQ from a row controller 5.

Between the bit lines BL and BBL, there is also provided a sense amplifier 6 for amplifying the potential difference between the potential of the bit line BL and that of the bit line BBL. The sense amplifier 6 is driven by a sense amplifier driver 7 activated by an activate signal SEN from the row controller 5.

After receiving a row address strobe signal BRAS, the row controller 5 outputs an equalize signal BEQ. The activate signal SEN is outputted a certain time after the equalize signal BEQ has been outputted.

The sense amplifier 6 contains a PMOS FET sense amplifier section 8 and an NMOS FET sense amplifier section 9. A driving signal line SAP is connected to the PMOS sense amplifier section 8 and a driving signal line BSAN is connected to the NMOS FET sense amplifier section 9.

The sense amplifier driver 7 contained in the DRAM of FIG. 5 is composed of a circuit shown in FIG. 6.

As shown in FIG. 6, the sense amplifier driver 7 contains a PMOS FET 10 that supplies a VCC level signal as a driving signal to a driving signal line SAP, an NMOS FET 13 that supplies a VSS level potential (the ground potential) as a driving signal to a driving signal line BSAN, an NMOS 11 that supplies a VBL level (about VCC/2 level) potential as a precharge potential to a driving signal line SAP, and an NMOS 12 that supplies about a VBL level potential as a precharge potential to a driving signal line BSAN. The PMOS FET 10 and NMOS FET 13 constitute a sense amplifier driver section 14 and the NMOS FET 11 and NMOS FET 12 constitute a sense amplifier precharger section 15.

The driver section 14 is supplied with the activate signal SEN outputted from the row controller 5 and the signal BSEN obtained by inverting the activate signal SEN in level by an inverter section 16. Specifically, the activate signal SEN is supplied to the gate of the NMOS FET 13 and the inverted activate signal BSEN is supplied to the gate of the PMOS 10.

The precharger section 15 is supplied with the inverted activate signal BSEN. Specifically, the inverted activate signal BSEN is supplied to the gates of the NMOS FET 11 and NMOS FET 12. This allows the PMOS FET 11 and NMOS FET 12 to supply the VBL level potential to the driving signal lines SAP, BSAN during the time when the sense amplifier 6 is inactive. On the other hand, during the time when the sense amplifier 6 is active, the PMOS 10 supplies the VCC level potential to the driving signal line SAP and the NMOS 13 supplies the VSS level potential to the driving signal line BSAN.

FIG. 7 is an operating waveform diagram to help explain the operation of the DRAM of FIGS. 5 and 6.

In the DRAM of FIGS. 5 and 6, control to precharge the driving signal line pair of SAP and BSAN is effected by the inverted activate signal BSEN, not by the equalize signal BEQ. Namely, the row controller 5 controls the equalizer 4 and the precharger section 15 independently. This prevents the potential of the driving signal line pair of SAP and BSAN from being unstable during the time when the equalize signal BEQ is in the L level, especially during the time when both of the equalize signal BEQ and the activate signal SEN are in the L level. Therefore, even if the activate signal SEN is outputted later than the equalize signal BEQ, the sense amplifier 6 will not operate erroneously.

(A second embodiment)

Next, a DRAM according to a second embodiment of the present invention will be explained.

FIG. 8 is a circuit diagram of a sense amplifier driver 7-2 contained in a DRAM according to a second embodiment of the present invention.

As shown in FIG. 8, the sense amplifier driver 7-2 contains a driver and precharger control signal generator 20. The generator 20 receives an activate signal SEN and generate from the activate signal SEN a control signal SANG for controlling a driver section 14 and a control signal BSANG for controlling a precharger section 15. Because the generator 20 produces the control signal SANG and the control signal BSANG from the activate signal SEN, this enables the equalizer 4 and precharger section 15 to be controlled independently as in the first embodiment. The generator 20 disclosed in the present embodiment generates the control signal SANG and the control signal BSANG with a delay between them.

If the turning on of the driver section 14 and the turning off of the precharger section 15 are effected with the same timing, a penetrating current can flow from the potential VBL to the potential VSS via the BSAN precharger (e.g., the NMOS FET 12 shown in FIG. 6) and the BSAN driver (e.g., the NMOS FET 13 shown in FIG. 6). The generator 20, however, generates the control signal SANG and the control signal BSANG with a delay between them and controls the driver section 14 and the precharger section 15 by the control signals SANG, BSANG, respectively, thereby preventing the penetrating current.

FIG. 9 is a circuit diagram of the control signal generator 20 shown in FIG. 8. As shown in FIG. 9, the generator 20 contains an SANG converter 21 that receives the activate signal SEN and converts the activate signal SEN into the control signal SANG and outputs the control signal SANG and a BSANG converter 22 that receives the activate signal SEN and converts the activate signal SEN into the control signal BSANG and outputs the control signal BSANG.

The SANG converter 21 contains a delay circuit 23 with a delay time of $\tau 1$ that receives the activate signal SEN at one terminal and outputs the control signal SANG at the other terminal. The activate signal SEN is delayed for time $\tau 1$ by the delay circuit 23 and thereby converted into the control signal SANG.

The BSANG converter 22 contains a branch node 24 that branches a single activate signal SEN into two signals, a delay circuit 25 with a delay time of $\tau 2$ that receives one branched activate signal SEN at one terminal and outputs a delayed activate signal SEN' at the other terminal, and a logic circuit 26 that receives the other branched activate signal SEN at one input terminal and the delayed activate signal SEN' at the other input terminal, combines these activate signals SEN and SEN' logically, outputs the control signal BSANG at the output terminal. In the present embodiment, the logic circuit 26 is a NOR circuit.

FIG. 10 is a concrete circuit diagram of the delay circuits 23, 25 shown in FIG. 9, each of which is composed of inverters Q1, Q2 and a capacitor C. Although the delay time can be adjusted by changing the capacitance of the capacitor C, it may be adjusted by changing the number of inverters each coupling a capacitor in such a manner as Q2 and C.

Figure 11:
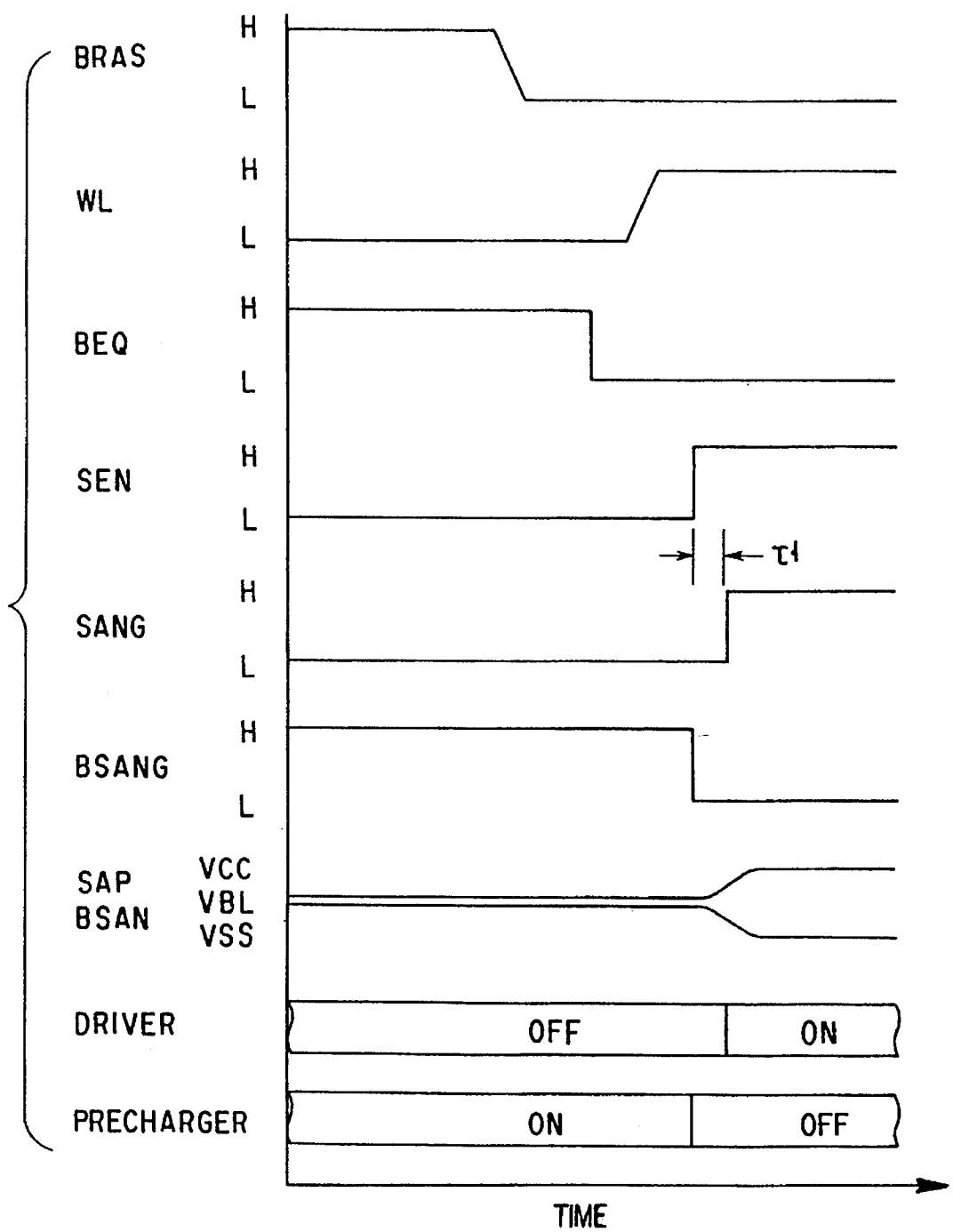
FIG. 11 is an operating waveform diagram to help explain the operation of a DRAM according to the second embodiment.

FIG. 11 is an operating waveform diagram to help explain the operation of a DRAM containing the generator 20 shown in FIG. 9.

As shown in FIG. 11, the control signal SANG rises time $\tau 1$ later than the rising of the activate signal SEN. In response to the rising of the control signal SANG, the driver section 14 is turned on.

In response to the rising of the activate signal SEN, the control signal BSANG goes low, because the logic circuit 25 of FIG. 9 contains NOR logic. In response to the falling of the control signal SANG, the precharger section 15 is turned off.

When the precharger section 15 is turned off before the time that the driver section 14 is turned on as described above, this prevents a penetrating current from flowing from the potential VBL toward the potential VSS.

The turning off of the driver section 14 and the turning on of the precharger section 15 may be prevented from being effected at the same time by setting the delay time $\tau 1$ of the delay circuit 23 of FIG. 9 shorter than the delay time $\tau 2$ of the delay circuit 25.

FIG. 12 is an operating waveform diagram to help explain the operation of the DRAM at the time when the delay time $\tau 1$ is set shorter than the delay time $\tau 2$.

As shown in FIG. 12, the timing that the driver section 14 turns on and the precharger section 15 turns off is the same as the timing shown in FIG. 11.

The control signal SANG falls time $\tau 1$ later than the falling of the activate signal SEN. In response to the falling of the control signal SANG, the driver section 14 is turned off.

The delayed activate signal SEN' falls time $\tau 2$ later than the falling of the activate signal SEN. In response to the falling of the delayed activate signal SEN', the control signal BSANG goes high. Responding to the rising of the control signal BSANG, the precharger section 15 is turned on.

As a result of the precharger section 15 being turned on after the driver section 15 is turned off, a penetrating current is prevented from flowing from the potential VBL toward the potential VSS as described above.

In the DRAMs of the first and second embodiments, the equalizer 4 is separated from the sense amplifier 6. In a DRAM, the equalize circuit 4 may be provided between the PMOS FET section 8 of the sense amplifier 6 and the NMOS FET section 9 of the sense amplifier 6. This arrangement, of course, produces a similar effect to what has been described above.

The driver section 14 is not limited to the circuit configuration shown in the figures. Another circuit may be added to the configuration as long as it contains at least the PMOS FET 10 and NMOS FET 13 for supplying the power supply potentials VCC and VSS to the driving signal lines SAP, BSAN. Similarly, an additional circuit may be added to the precharger 15 as long as it contains at least the NMOS FET 11 and NMOS FET 12 for supplying the precharge potential VBL to the driving signal lines SAP, BSAN.

(A third embodiment)

Hereinafter, as a third embodiment of the present invention, a special DRAM to which the invention can be applied most suitably will be explained.

Figure 13:
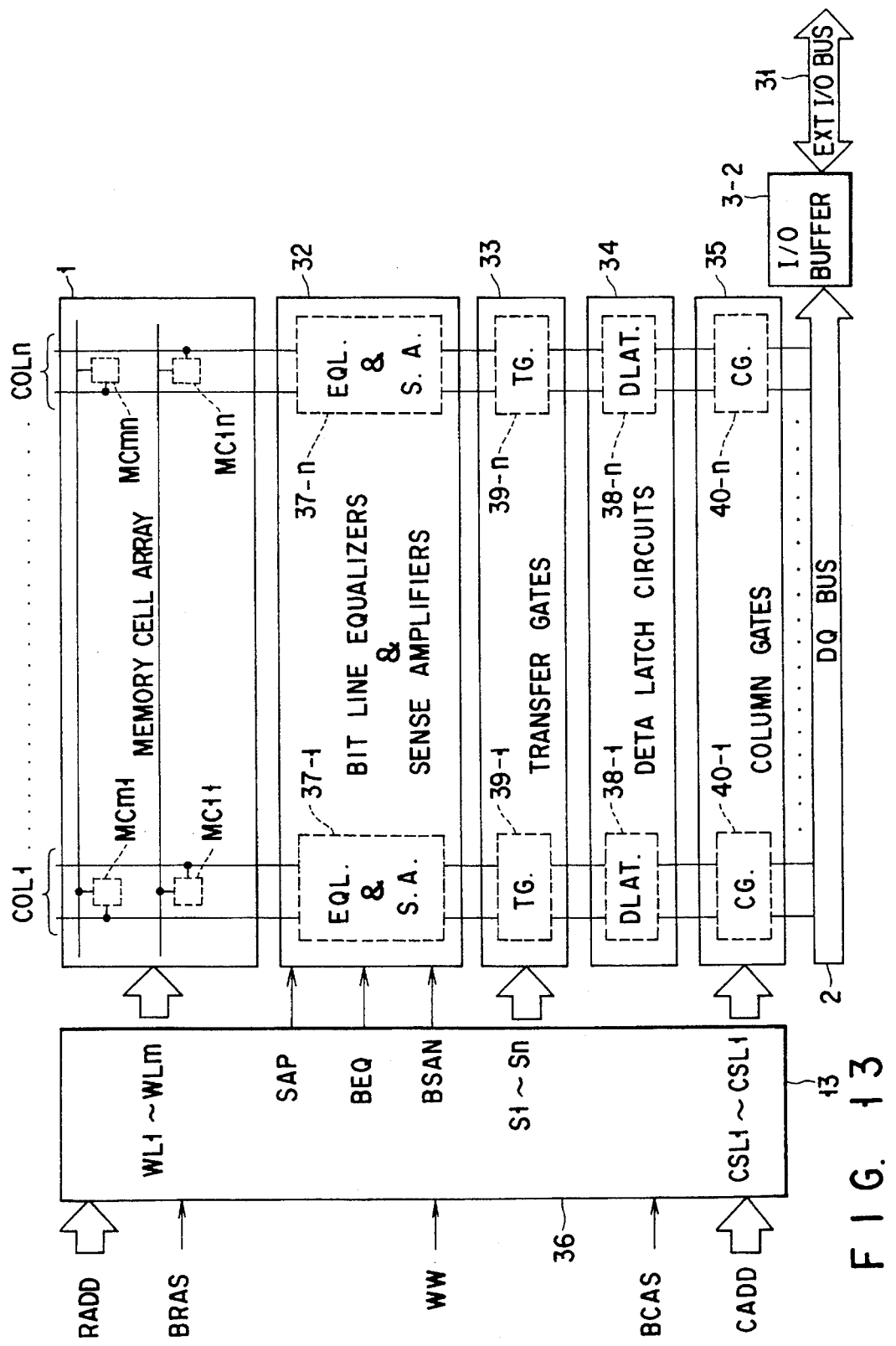
FIG. 13 is a block diagram of a special DRAM to which the present invention is applied.
Figure 14:
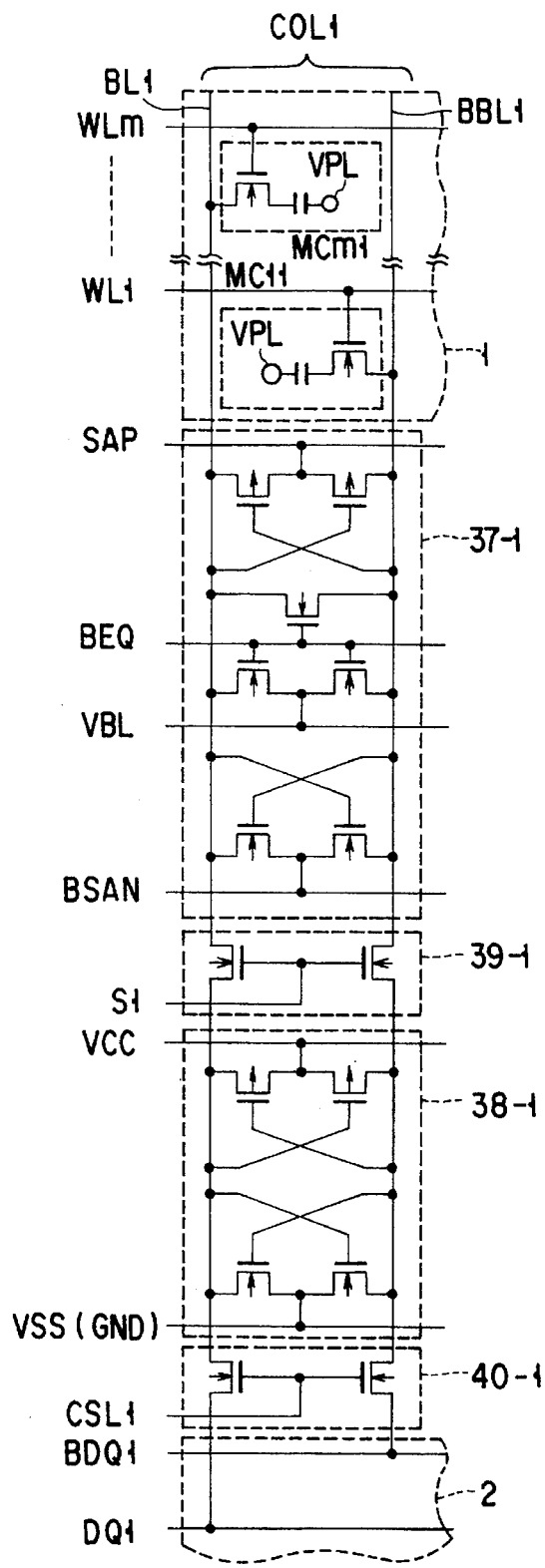
FIG. 14 is a circuit diagram of a circuit attached to the column of FIG. 13.

FIG. 13 is a schematic block diagram of a special DRAM to which the present invention have been applied. FIG. 14 is a circuit diagram of a circuit attached to the columns shown in FIG. 13.

As shown in FIGS. 13 and 14, a chip contains a memory cell array 1 with n rows×n columns in which a plurality of memory cells MC11 to MCmn are integrated. The memory cell array 1 is provided with bit-line pairs COL1 to COLn, which connect the memory cells MC11 to MCmn to a DQ bus 2. The DQ bus 2 is connected to an I/O buffer 3-2. The I/O buffer 3-2 performs data transfer from an external I/O bus 31 provided outside the device to the DQ bus 2 and from the DQ bus 2 to the external I/O bus 31.

Between the memory cell array 1 and the DQ bus, an equalizer and sense amplifier group 32, a transfer gate group 33, a data latch group 34, and a column gate group 35 are provided. The equalizer and sense amplifier group 32 contains n equalizer and sense amplifiers 37-1 to 37-n provided for each of bit-line pairs COL1 to COLn.

The equalizer and sense amplifiers 37-1 to 37-n are controlled by the driving signals SAP, BSAN and equalize signal BEQ outputted from a peripheral circuit section 36. As shown in FIG. 14, the equalizer and sense amplifier 37-1 is composed of an equalizer sandwiched between the PMOS FET section and NMOS FET section of the sense amplifier, and has the same function as that of the equalizer 4 and sense amplifier 6 of the DRAM shown in FIG. 5.

The data latch group 34 contains n data latches 38-1 to 38-n provided for each of bit line pairs COL1 to COLn. As shown in FIG. 14, each of the data latches 38-1 to 38-n is composed of an ordinary cross-coupled CMOS latch circuit. The data latches 38-1 to 38-n have the function of temporarily storing the data supplied from the DQ bus 2.

The transfer gate group 33 contains n transfer gates 39-1 to 39-n provided for each of bit-line pairs COL1 to COLn. The control gates 39-1 to 39-n are controlled by the transfer gate select signals S1 to Sn outputted from the peripheral circuit section 36 so as to be made conducting according to the column whose data is required to be rewritten. When the transfer gates 39-1 to 39-n conduct, they transfer, in unison, the data group temporarily stored in the data latches 38-1 to 38-n from the data latches 38-1 to 38-n to the equalizer and sense amplifiers 37-1 to 37-n.

The column gate group 35 contains n column gates 40-1 to 40-n provided for each of bit-line pairs COL1 to COLn. The column gates 40-1 to 40-n are controlled by the column select signals CSL1 to CSL1 outputted from the peripheral circuit section 36. The construction and function of the column gates 40-1 to 40-n are similar to those of an ordinary DRAM.

The write operation in the DRAM of FIG. 13 will be described with reference to FIGS. 13 to 18.

Figure 16:
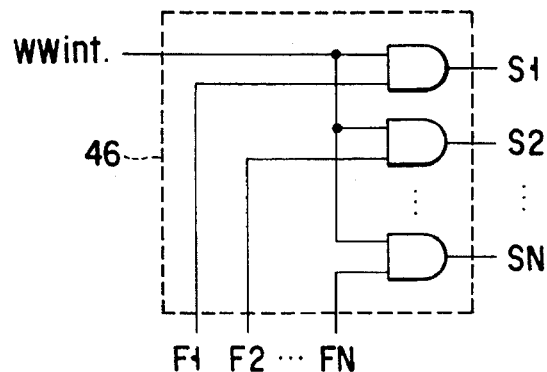
FIG. 16 is a circuit diagram of the transfer gate selector of FIG. 15.
Figure 17:
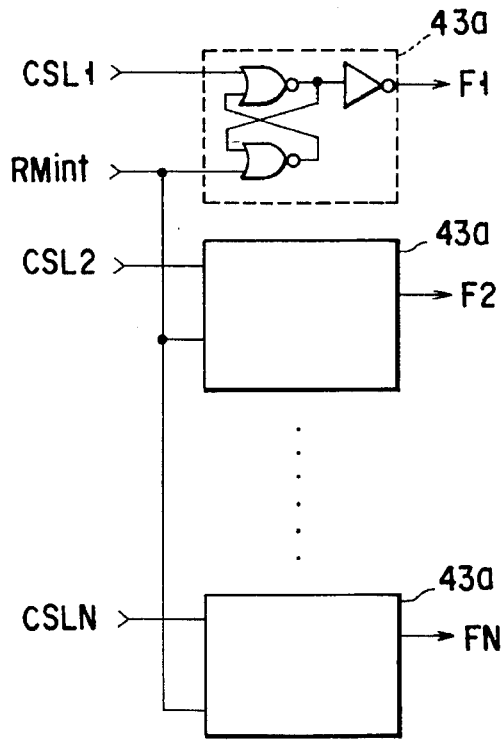
FIG. 17 is a circuit diagram of the write flag register of FIG. 15.
Figure 18:
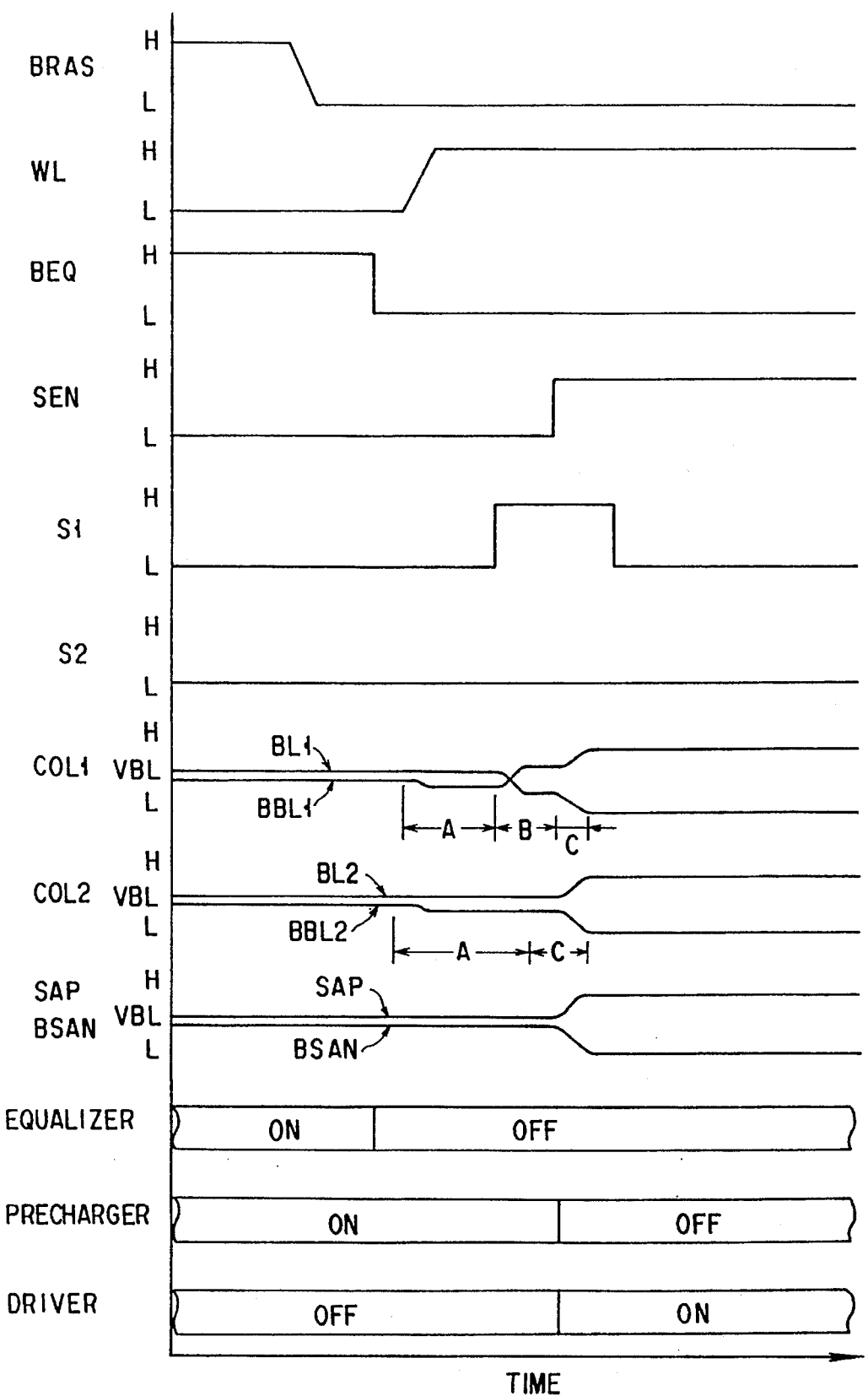
FIG. 18 is an operating waveform diagram to help explain the operation a special DRAM to which the present invention is applied.

FIG. 15 is a schematic block diagram of the peripheral circuit section 36 of FIG. 13. FIG. 16 is a circuit diagram of the transfer gate selector of FIG. 15. FIG. 17 is a circuit diagram of the write flag register of FIG. 15. FIG. 18 is an operating waveform diagram to help explain the operation of the DRAM shown in FIGS. 13 to 17.

First, the data is inputted from the external I/O bus 31 to the DQ bus 32 via the I/O buffer 3-2. At the same time, or immediately before or after this, the column address CADD is externally inputted to the column address buffer 41 of FIG. 15. Of the column select signals CSL1 to CSL1, the one corresponding to the inputted column address CADD is outputted from the column decoder 42. Of the column gates 40-1 to 40-n shown in FIG. 13, the one receiving the column select signal CSL is activated. The data inputted to the DQ bus 2 is written into the data latch 38 connected to the activated column gate 40. Such an operation is repeated a specific number of times, with the write data and input column address CADD being changed each time.

At this time, the data is not necessarily written into all of the n data latches 38-1 to 38-n. Therefore, in the DRAM explained in the present embodiment, the information that which of the n data latches 38-1 to 38-n or which of the columns the data has been written into is stored in the write flag register 43. The write flag register 43 outputs the n flag signals F1 to Fn set correspondingly to the columns COL1 to COLn. These flag signals F1 to Fn place the columns to have been written into at an H (high) level and the columns not to have been written into at an L (low) level, making it possible to judge whether or not the data has been written for each of the columns COL1 to COLn.

The data is written into the data latches 38-1 to 38-n with the transfer gate activate signal WW at the L level, or with all of the data transfer gates 39-1 to 39-n being off. In this state, when one line of data has been written from the DQ bus 2 into the data latches 38-1 to 38-n, control moves to the operation of transferring the written data from the data latches 38-1 to 38-n to the equalizer and sense amplifiers 37-1 to 37-n and the memory cells MC11 to MCnm provided in the memory cell array 1. The operation is performed as follows.

As shown in FIG. 18, to determine which line in the memory cell array 1 one line of data should be transferred to, the row address input RADD is inputted to the row decoder 45 via the row address buffer 44 in synchronization with the rising of the row address strobe signal BRAS. Thereafter, of the word lines WL1 to WLm, the one WL corresponding to the inputted row address RADD is activated by the row decoder 45. Before the word line WL is activated, the falling of the signal BRAS causes the equalize signal BEQ to fall, thus turning off the bit-line pair equalizer. At this time, because the precharger section 15 is on, the potential of the driving signal pair of SAP, BSAN is fixed at the precharge potential VBL. Therefore, the bit-line pair sense amplifier is inactive. In this state, the word line WL is activated, allowing one line of data to appear from the memory cell MC at the respective columns COL1 to COLn.

FIG. 18 shows the waveforms for two columns, column COL1 and column COL2. In FIG. 18, the period when the data stored in the memory cell MC appears at the columns is indicated by the reference symbol A.

After one line of data has been written, the transfer gate activate signal WW is placed at the H level in this state. In the transfer gate selector 46 of FIG. 16, of the transfer gate control signals S1 to Sn, only the one corresponding to the column for which the write flag is up (the signal F is at the H level) goes to the H level. In FIG. 18, the control signal S1 is at the H level.

In this way, of the n data latches 38-1 to 38-n, the data latch 38 into which the data has been written transfers the new data to the selected column (in this example, only COL1) in unison via the conducting one (in this example, only the transfer gate 39-1) of the transfer gates 39-1 to 39-n. In the selected column, the previously stored data is replaced with the new data. In FIG. 18, the period when the data is rewritten is indicated by the reference symbol B.

Thereafter, the sense amplifier activate signal SEN rises later than the falling of the equalize signal BEQ. The activate signal SEN may be controlled so as to rise later than the rising of the word line WL, in response to the rising of the word line WL. The rising of the activate signal SEN turns off the precharger section 15 and instead turns on the driver section 14. This allows the power supply potential to be supplied to the driving signal line pair of SAP, BSAN, placing the driving signal line SAP at the VCC level and the driving signal line BSAN at the VSS level. This activates the bit-line pair sense amplifier, which amplifies the data appearing at the columns COL1 to COLn in the form of the bit line potential. In FIG. 18, the period when the data is amplified is indicated by the reference symbol C.

The updated data amplified by the activated sense amplifier is written into the memory cell MC in the selected column COL1 as shown in FIG. 18. In the unselected column COL2 in FIG. 18, a similar operation to the data refresh operation in an ordinary DRAM is performed, thereby causing the data originally stored in the memory cell MC to be written into the memory cell MC again.

As described above, with the above DRAM, instead of rewriting the data column by column, the rewriting data is temporarily stored in the data latches 38-1 to 38-n and at the time when all of one line of data to be rewritten has been prepared, all of the data is transferred in unison to the equalizer and sense amplifier 37, which amplifies the data, which is then written into the memory cell MC.

The faulty operation of the bit-line pair sense amplifier can be eliminated by using the sense amplifier driver 7 (FIG. 6) with the configuration explained in the first embodiment or the sense amplifier driver 7-2 (FIG. 8) with the configuration explained in the second embodiment for a special DRAM sense amplifier having the configuration shown in FIGS. 13 to 17 and the operating sequence shown in FIG. 18. Namely, because the driving signal lines SAP, BSAN are fixed to the precharge potential VBL until practically just before the sense amplifier is activated, the driving signal lines are prevented from dropping to a low potential before the sense amplifier is activated. This reduces the possibility that the sense amplifier will be activated by accident or operate erroneously before it is activated, with the result that it is possible to prevent the erroneous writing of data due to the aforesaid faulty operation of the sense amplifier.

When the sense amplifier driver of the present invention has been used in a special DRAM having the configuration shown in FIGS. 13 to 17 and the operating sequence shown in FIG. 18, the following problem has been solved at the same time.

Figure 19:
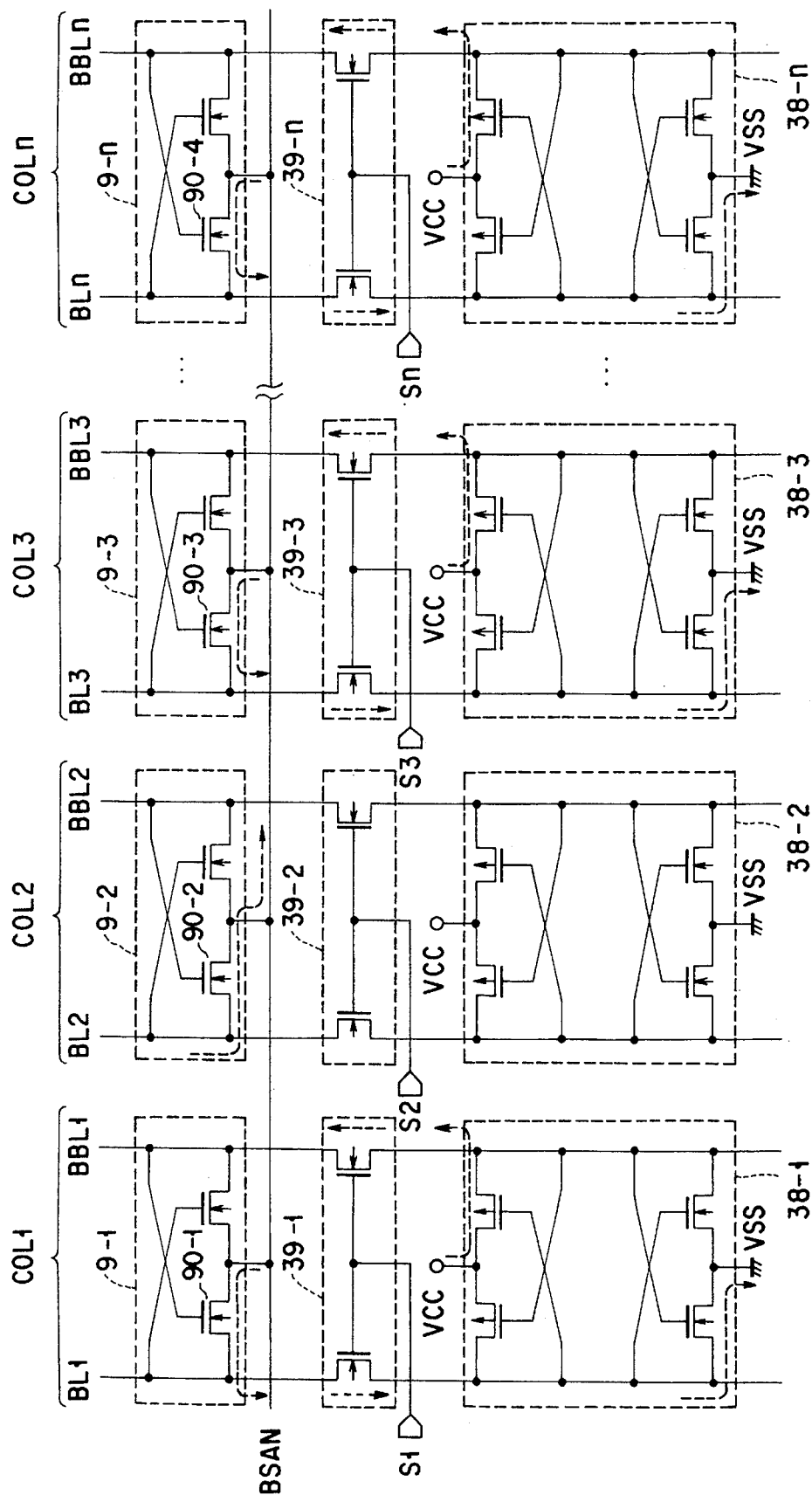
FIG. 19 is a diagram to help explained the problem caused in a special DRAM.
Figure 20:
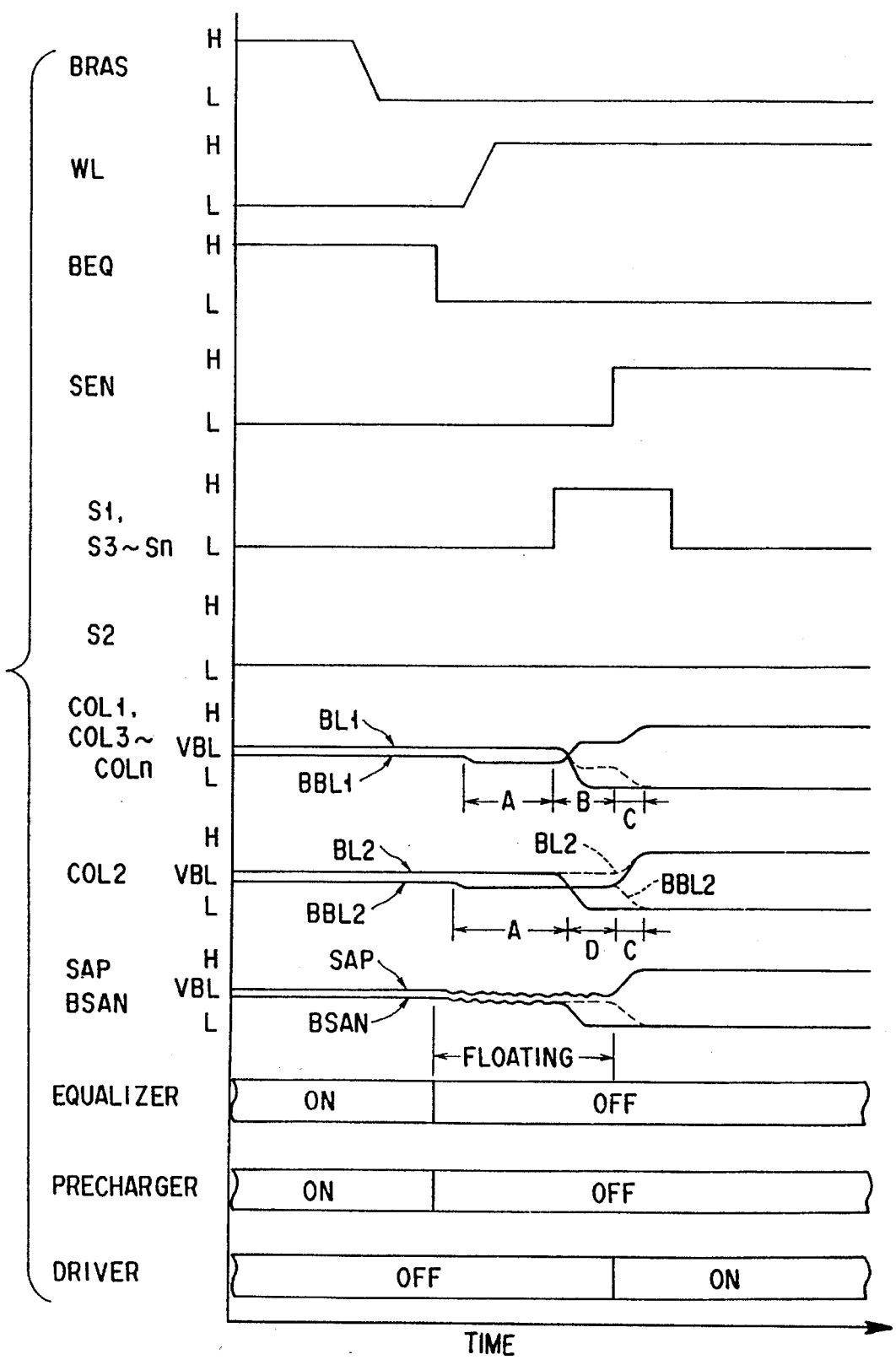
FIG. 20 is an operating diagram to help explain the operation at the time when a problem has arisen in a special DRAM.

FIG. 19 is a diagram to help explain the problem caused in a special DRAM. FIG. 20 is an operating waveform diagram to help explain the operation at the time when the problem has arisen.

As shown in FIG. 19, when all of the columns COL1, COL3 to COLn other than column COL2 transfer data, that is, the number of data transfers is large, the data can be inverted in the column COL2 that transfers no data.

As shown in FIG. 19, the data latches 38-1 to 38-n are cross-coupled CMOS latch circuits. In the latch circuits of this type, the rewriting data is retained by, for example, grounding the bit line BL and placing the inverted bit line BBL at a high potential VCC (or by placing the bit line BL at the high potential VCC and grounding the inverted bit line BBL). In this state, when the transfer gates 39-1, 39-3 to 39-n are turned on, the potential of the bit line BL near the NMOS FET sections 9-1, 9-3 to 9-n in the sense amplifier is dropped toward the ground potential VSS, whereas the potential of the inverted bit line BBL is raised toward the high voltage VCC.

Figure 2:
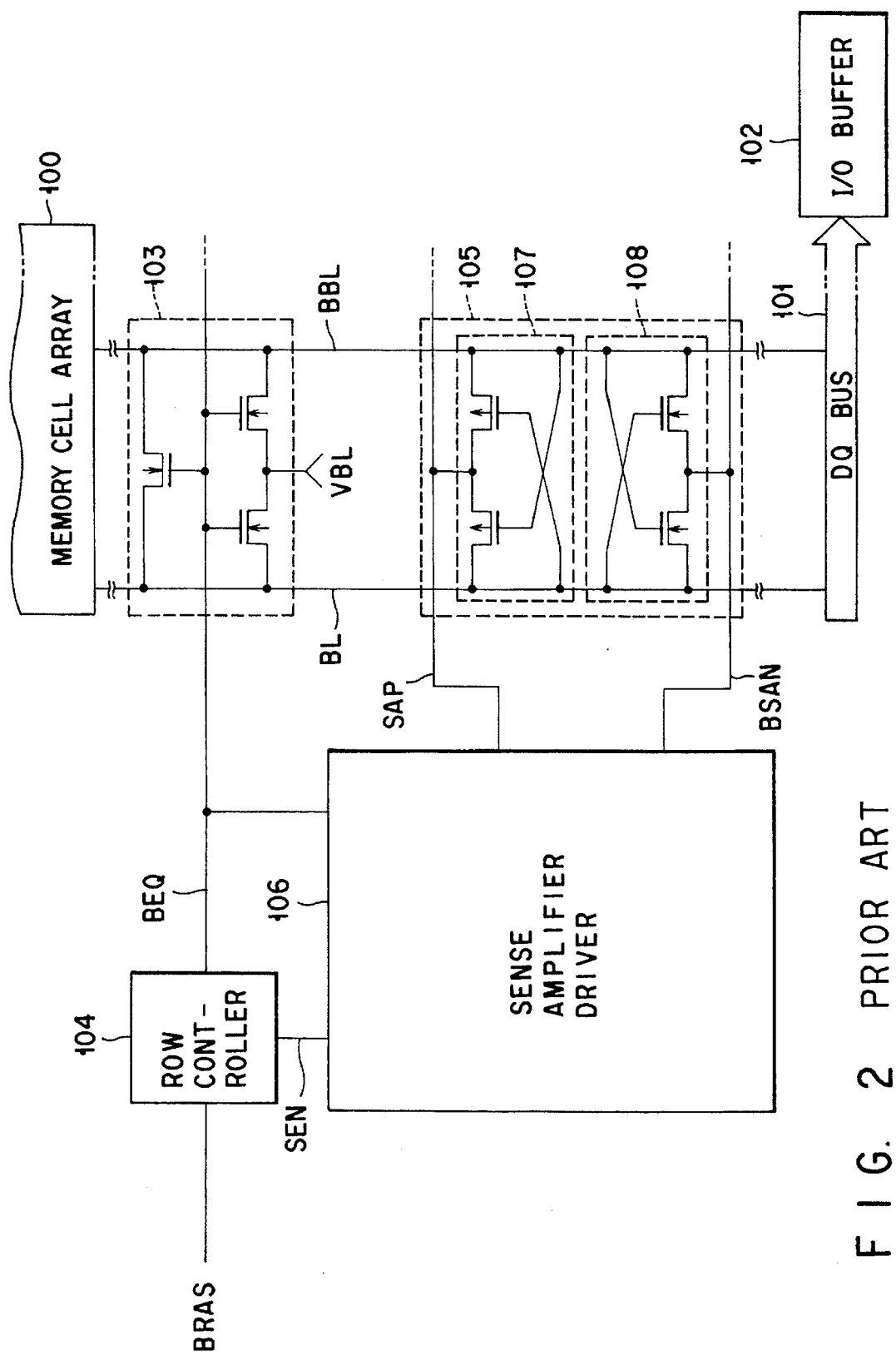
FIG. 2 is a circuit diagram of a sense amplifier and an equalizer in a conventional DRAM.
Figure 3:
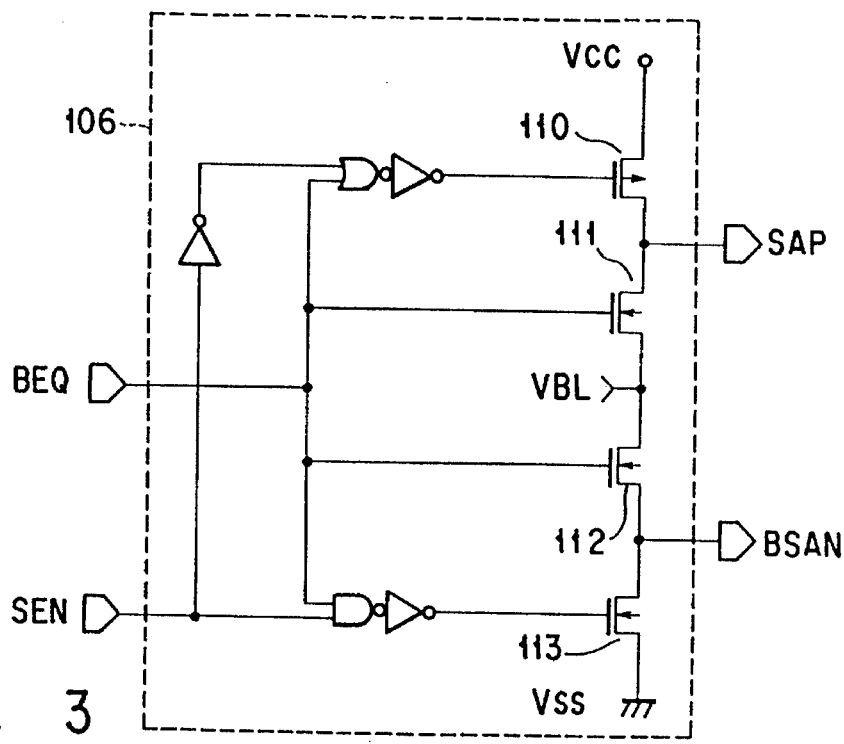
FIG. 3 is a circuit diagram of the sense amplifier driver of FIG. 2.
Figure 4:
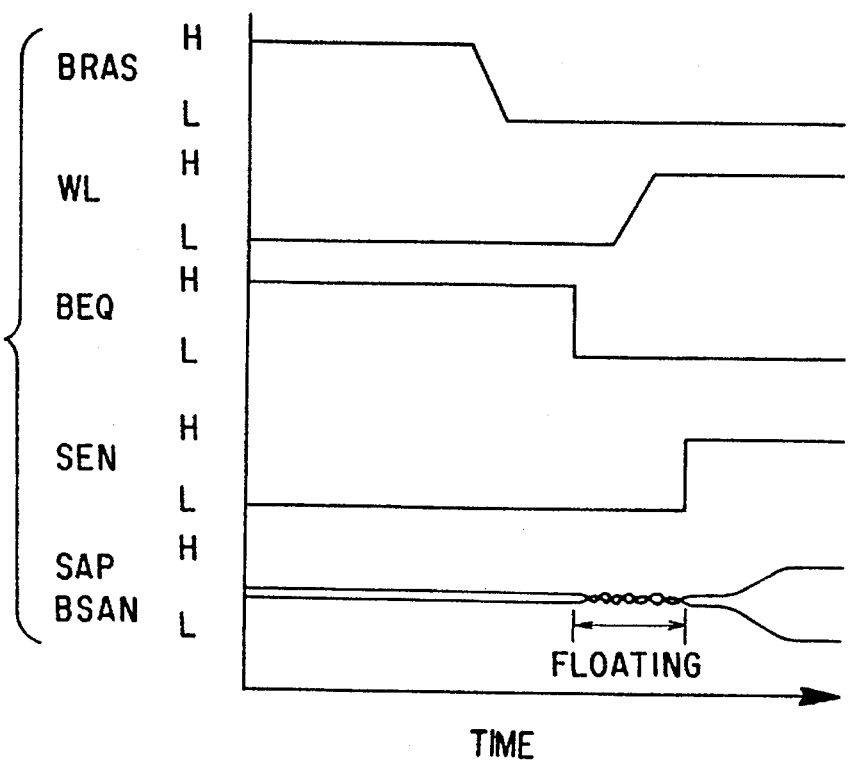
FIG. 4 is an operating waveform diagram to help explain the operation of the sense amplifier in a conventional DRAM.

In this state, the NMOS FET 90-1, 90-3 to 90-n whose gates are connected to the inverted bit line BBL contained in the NMOS FET sections 9-1, 9-3 to 9-n can turn on. When these NMOS FETs have turned on, the potential of the driving signal line BSAN that should be the precharge potential VBL drops to the ground potential VSS. Use of the sense amplifier driver 106 as shown in FIG. 3 makes the potentials of the driving signal line SAP and the driving signal line BSAN unstable (floating), so that the potential of the driving signal line BSAN is liable to drop to the ground potential VSS.

When the potential of the driving signal line BSAN has dropped to the ground potential VSS before the sense amplifier is activated, the potential of the bit line BL2 that should have been higher than that of the inverted bit line BBL2 is pulled toward the ground potential VSS of the driving signal line BSAN and drops below the potential of the inverted bit line BBL 2 in the column COL2 during the period shown by the reference symbol D in FIG. 20. As a result, the data on the bit-line pair in COL2 is inverted. In this state, when the sense amplifier is activated and the data is amplified as during the period indicated by the reference symbol C, the inverted data is written into the memory cell MC in the column COL2. Namely, the erroneous writing of the data has taken place because of faulty operation of the sense amplifier. The dotted lines in FIG. 20 are the lines that should be there in the proper operation.

Use of the sense amplifier drivers 7, 7-2 in the first and second embodiments enables the driving signal pairs SAP, BSAN to be fixed at the precharge potential VBL until immediately before the sense amplifier is activated, that is, until immediately before the driver 14 is turned on. This makes it possible to prevent the driving signal BSAN from dropping to the ground potential VSS before the sense amplifier is activated. Therefore, by applying the present invention to a special DRAM that transfers one line of data to the equalizer and sense amplifier at a time, it is possible to reduce the possibility that the sense amplifier explained in FIGS. 19 and 20 will operate erroneously and thereby to prevent the erroneous writing of data due to the faulty operation of the sense amplifier.

As described above, with the present invention, it is possible to provide a semiconductor memory device capable of reducing the possibility that the sense amplifier will operate erroneously.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells including at least a first memory cell and a second memory cell;
   a first bit line connected to said first memory cell;
   a second bit line connected to said second memory cell and paired with said first bit line;
   equalize means that is connected between said first bit line and said second bit line and equalizes the potential difference between the potential of said first bit line and that of said second bit line;
   amplifying means that is connected between said first bit line and said second bit line and amplifies the potential difference between the potential of said first bit line and that of said second bit line;
   a first driving signal line that is connected to said amplifying means and drives said amplifying means;
   a second driving signal line that is connected to said amplifying means and paired with said first driving signal line;
   driving means that drives said amplifying means, said driving means being connected to said first driving signal line and said second driving signal line and containing precharge means for presetting the potential of said first driving signal line and that of said second driving signal line to a predetermined precharge potential and driving signal supply means for supplying a driving signal to said first driving signal line and said second driving signal line; and
   control means for controlling said equalize means and said driving means, wherein
   said control means controls said equalize means and said precharge means independently so that said precharge means continues supplying said precharge potential to said first driving signal line and said second driving signal line until essentially immediately before said driving signal supply means supplies said driving signal to said first driving signal line and said second driving signal line.

2. A semiconductor memory device according to claim 1, wherein said control means performs control so that the timing that said precharge means contained in said driving means is deactivated is later than the timing that said equalize means is deactivated.

3. A semiconductor memory device according to claim 1, wherein said control means outputs a first activate signal for activating said equalize means and a second activate signal for activating said driving means and, using only said second activate signal, controls said precharge means contained in said driving means and said driving signal supply means contained in said driving means.

4. A semiconductor memory device according to claim 3, wherein said control means outputs said second activate signal after a predetermined time has elapsed since it outputted said first activate signal.

5. A semiconductor memory device according to claim 3, wherein said driving means further contains generating means for generating from said second activate signal a first control signal for controlling said driving signal supply means and a second control signal for controlling said precharge means.

6. A semiconductor memory device comprising:
   a plurality of memory cells including at least a first memory cell and a second memory cell;
   a first bit line connected to said first memory cell;
   a second bit line connected to said second memory cell and paired with said first bit line;
   equalize means that is connected between said first bit line and said second bit line and equalizes the potential difference between the potential of said first bit line and that of said second bit line;
   amplifying means that is connected between said first bit line and said second bit line and amplifies the potential difference between the potential of said first bit line and that of said second bit line;
   a first driving signal line that is connected to said amplifying means and drives said amplifying means;
   a second driving signal line that is connected to said amplifying means and pairs with said first driving signal line;
   driving means that drives said amplifying means, said driving means being connected to said first driving signal line and said second driving signal line and containing precharge means for presetting the potential of said first driving signal line and that of said second driving signal line to a predetermined precharge potential, driving signal supply means for supplying a driving signal to said first driving signal line and said second driving signal line; and
   control means that controls said equalize means and said driving means,
   said control means independently outputting a first activate signal for activating said equalize means and a second activate signal that is a predetermined time later than said first activate signal and activates said driving means,
   said driving means further including generating means for generating from said second activate signal a first control signal for controlling said driving signal supply means and a second control signal for controlling said precharge means;
   wherein said precharge means continues supplying said precharge potential to said first driving signal line and said second driving signal line until essentially immediately before said driving signal supply means supplies said driving signal to said first driving signal line and said second driving signal line, and
   said generating means activates said first control signal and said second control signal with a delay between them so that said precharge means and said driving signal supply means each is activated with different timing.

7. A semiconductor memory device according to claim 6, wherein said generating means activates said first control signal later than said second control signal.

8. A semiconductor memory device according to claim 6, wherein said generating means deactivates said second control signal later than said first control signal.

9. A semiconductor memory device according to claim 6, wherein said generating means contains first conversion means that converts said second activate signal into said first control signal via first delay means, and
   second conversion means that receives said second activate signal and a delayed activate signal obtained by delaying said second activate signal via second delay means, logically combines said second activate signal and said delayed activate signal, and converts said second activate signal into said second control signal.

10. A semiconductor memory device according to claim 9, wherein the delay time of said first delay means is set shorter than the delay time of said second delay means.

11. A semiconductor memory device comprising:

a memory cell array in which a plurality of memory cells are arranged in rows and columns;

a plurality of pairs of bit lines, to each of which said plurality of memory cells provided in the corresponding one of said columns in said memory cell array and arranged in the direction of said columns are connected;

a plurality of equalize means, each of which is connected between the bit lines of the corresponding one of said plurality of pairs of bit lines and equalizes the potential difference between said bit lines;

a plurality of amplifying means, each of which is connected between the bit lines of the corresponding one of said plurality of pairs of bit lines and amplifies the potential difference between said bit lines;

a first driving signal line that is connected to said plurality of amplifying means and drives said amplifying means;

a second driving signal line that is connected to said plurality of amplifying means and paired with said first driving signal line;

driving means that drives said plurality of amplifying means, said driving means being connected to said first driving signal line and said second driving signal line and containing precharge means for presetting the potential of said first driving signal line and that of said second driving signal line to a predetermined precharge potential and driving signal supply means for supplying a driving signal to said first driving signal line and said second driving signal line;

a data bus serving as a path for the externally supplied input data items to said plurality of memory cells;

a plurality of latch-type storage means, each of which is provided in the corresponding one of said columns in said memory cell array, is connected to said data bus and temporarily stores the corresponding one of said input data items supplied from said data bus; and a plurality of transfer means, which are respectively connected between said plurality of latch-type storage means and said plurality of amplifying means and transfer, in unison for each of said rows, said input data items temporarily stored in said latch-type storage means from said latch-type storage means to said amplifying means, wherein after said equalize means has equalized the voltage between the bit lines of said pair, the operation of storing said corresponding input data item from said data bus into each of said plurality of latch-type storage means is repeated for each of said input data items, and after the operation of storing said input data in said plurality of latch-type storage means has been completed for one of said rows, said transfer means transfers said input data stored in said latch-type storage means to said amplifying means in unison, and thereafter said precharge means continues supplying a precharge potential to said first driving signal line and second driving signal line until essentially immediately before said driving signal supply means supplies said driving signal to said first driving signal line and said second driving signal line.

12. A semiconductor memory device according to claim 11, further comprising control means for controlling said plurality of equalize means and said driving means, wherein said control means controls the timing that said equalize means is deactivated to be later than the timing that said precharge means is deactivated.

13. A semiconductor memory device according to claim 12, wherein said control means outputs a first activate signal that activates said equalize means and a second activate signal that is outputted a predetermined time after said first activate signal has been outputted and activates said driving means, and using only said second activate signal, controls said precharge means and said driving signal supply means contained in said driving means, and before said predetermined time has elapsed since said control means outputted said first activate signal, the operation of storing said corresponding input data item from said data bus into each of said plurality of latch-type storage means is repeated for each of said input data items, and after the operation of storing said input data into said plurality of latch-type storage means has been completed for one of said rows, said control means outputs said second activate signal, and said first driving signal line and said second driving signal line are kept fixed at a precharge potential until essentially immediately before said amplifying means is activated.

14. A semiconductor memory device according to claim 11, wherein said driving means further contains generating means for generating from said second activate signal a first control signal that controls said supply means and a second control signal that controls said precharge means.

15. A semiconductor memory device according to claim 14, wherein said generating means activates said first control signal and said second control signal with a delay between them to prevent said precharge means and said driving signal supply means from being activated simultaneously.

16. A semiconductor memory device according to claim 14, wherein said generating means activates said first control signal later than said second control signal.

17. A semiconductor memory device according to claim 14, wherein said generating means deactivates said second control signal later than said first control signal.

18. A semiconductor memory device according to claim 14, wherein said generating means contains first conversion means that converts said second activate signal into said first control signal via first delay means, and second conversion means that receives said second activate signal and a delayed activate signal obtained by delaying said second activate signal via second delay means, logically combines said second activate signal and said delayed activate signal, and converts said second activate signal into said second control signal.

19. A semiconductor memory device according to claim 14, wherein the delay time of said first delay means is set shorter than the delay time of said second delay means.

20. A semiconductor memory device according to claim 11, further comprising, between said data bus and said latch-type storage means, column select means for selecting a column containing said memory means in which each of said input data items is to be stored.

* * * * *